(12) United States Patent
Zhang et al.

(10) Patent No.: US 7,654,701 B2
(45) Date of Patent: Feb. 2, 2010

(54) LED LAMP

(75) Inventors: Yu Zhang, Shenzhen (CN); Guang Yu, Shenzhen (CN); Cheng-Tien Lai, Taipei Hsien (TW)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/200,880

(22) Filed: Aug. 28, 2008

(65) Prior Publication Data

US 2009/0316403 A1 Dec. 24, 2009

(30) Foreign Application Priority Data

Jun. 18, 2008 (CN) .................. 2008 1 0067911

(51) Int. Cl.
*F21V 29/00* (2006.01)
(52) U.S. Cl. .................. 362/294; 362/249.02; 362/373; 362/800
(58) Field of Classification Search .................. 362/294, 362/373, 547, 545, 800, 249.02
See application file for complete search history.

(56) References Cited

U.S. PATENT DOCUMENTS

| 6,461,029 | B2 * | 10/2002 | Gronemeier et al. | ........ 362/545 |
| 2008/0080189 | A1 * | 4/2008 | Wang | .......... 362/294 |
| 2008/0089071 | A1 * | 4/2008 | Wang | .......... 362/294 |
| 2008/0158888 | A1 * | 7/2008 | Chen | .......... 362/294 |

* cited by examiner

*Primary Examiner*—Laura Tso
(74) *Attorney, Agent, or Firm*—Frank R. Niranjan

(57) ABSTRACT

An LED lamp includes a lamp frame, a plurality of LED modules, an envelope and a heat sink made of metal. The envelope and the heat sink are mounted on top and bottom sides of the lamp frame. A frame body of the lamp frame is attached to a top face of a base of the heat sink. A heat absorbing member made of metal and provided with a plurality of heat absorbing portions is attached on the top face of the base. The LED modules are attached on top boards of the heat absorbing portions. The envelope engages with the lamp frame and receives the heat absorbing member and the LED modules therein. The top boards are inclined downwards from a middle toward an outside of the heat absorbing member.

16 Claims, 4 Drawing Sheets

LED LAMP

BACKGROUND

1. Field of the Invention

The present invention relates to an LED lamp, and particularly to an LED lamp used as an outdoor street lamp.

2. Description of Related Art

An LED lamp is a type of solid-state lighting that utilizes light-emitting diodes (LEDs) as a source of illumination. The LED lamp is intended to be a cost-effective yet high quality replacement for incandescent and fluorescent lamp because of the LED making features of long-term reliability, environment friendliness and low power consumption.

A conventional LED lamp comprises a heat sink and a plurality of LED modules having LEDs attached on an outer surface of the heat sink to dissipate heat generated by the LEDs. The outer surface of the heat sink generally is planar. When the LED lamp works, the LEDs mounted on the planar outer surface of the heat sink only form a flat light source, thereby the illumination area and angle of the LED lamp are limited. In addition, the heat sink of the conventional LED lamp cannot efficiently dissipate the heat generated by the LEDs.

What is needed, therefore, is an LED lamp having large illumination area and angle. Furthermore, the LED lamp has a good heat dissipation efficiency.

SUMMARY

An LED lamp in accordance with a preferred embodiment of the present invention comprises a lamp frame, a plurality of LED modules, an envelope and a heat sink. The envelope and the heat sink are mounted on opposite top and bottom sides of the lamp frame. The lamp frame comprises a frame body and a cavity body extending from an end of the frame body. The heat sink has a base and a plurality of fins extending from opposite top and bottom faces of the base. The frame body is attached to the top face of the base and located between the fins on the top face of the base. A heat absorbing member provided with a plurality of heat absorbing portions is attached on a middle of the base. The LED modules are attached on corresponding heat absorbing portions. The envelope engages with the lamp frame and defines a receiving space for receiving the heat absorbing member and the LED modules. A pole engages with the lamp frame for mounting the LED lamp at a desired location.

Other advantages and novel features of the present invention will become more apparent from the following detailed description of an embodiment/embodiments when taken in conjunction with the accompanying drawings.

BRIEF DESCRIPTION OF THE DRAWINGS

Many aspects of the present LED lamp can be better understood with reference to the following drawings. The components in the drawings are not necessarily drawn to scale, the emphasis instead being placed upon clearly illustrating the principles of the present LED lamp. Moreover, in the drawings, like reference numerals designate corresponding parts throughout the several views.

DETAILED DESCRIPTION

Figure 1:
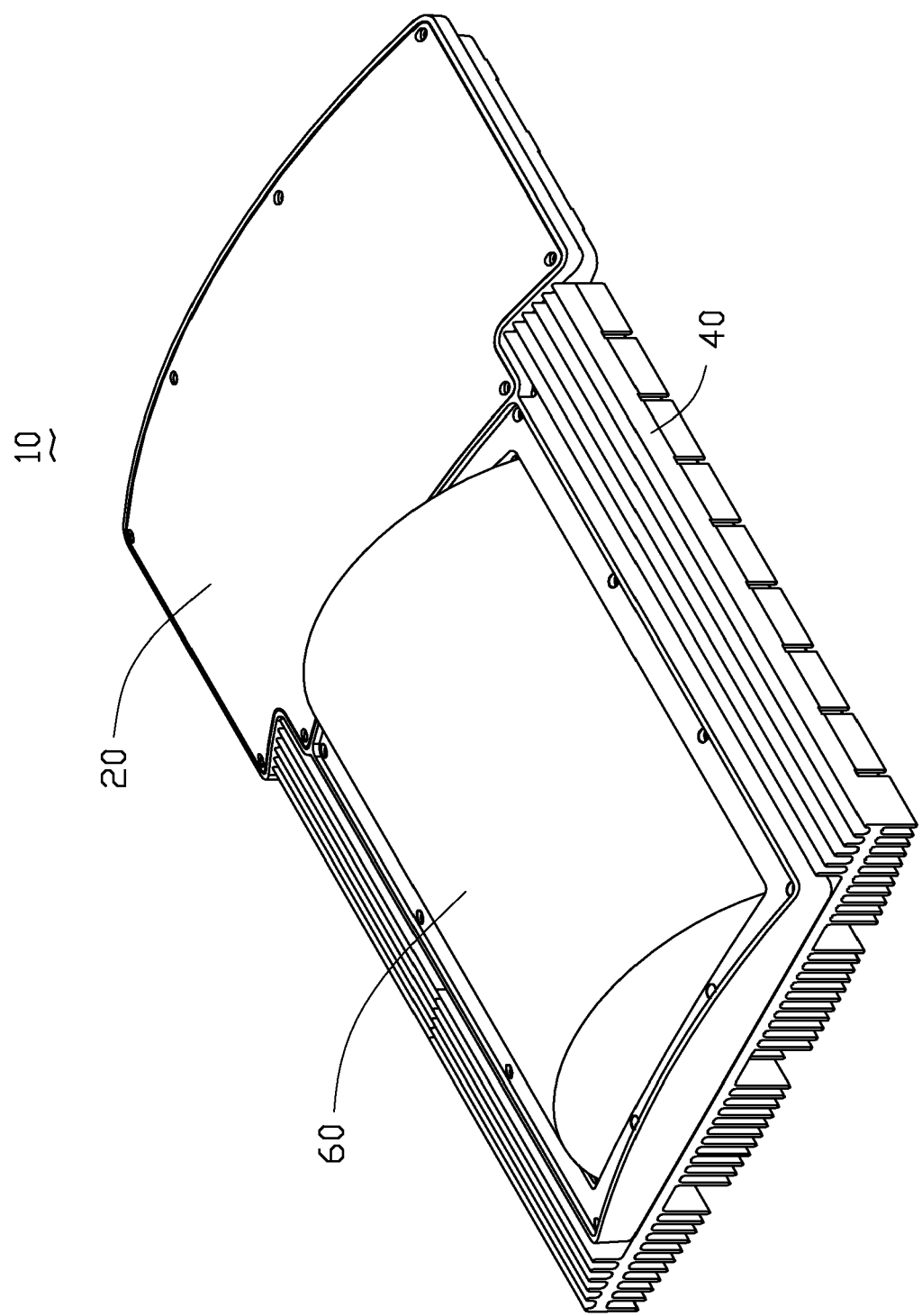
FIG. 1 is an isometric, assembled view of an LED street lamp in accordance with a preferred embodiment of the present invention.
Figure 2:
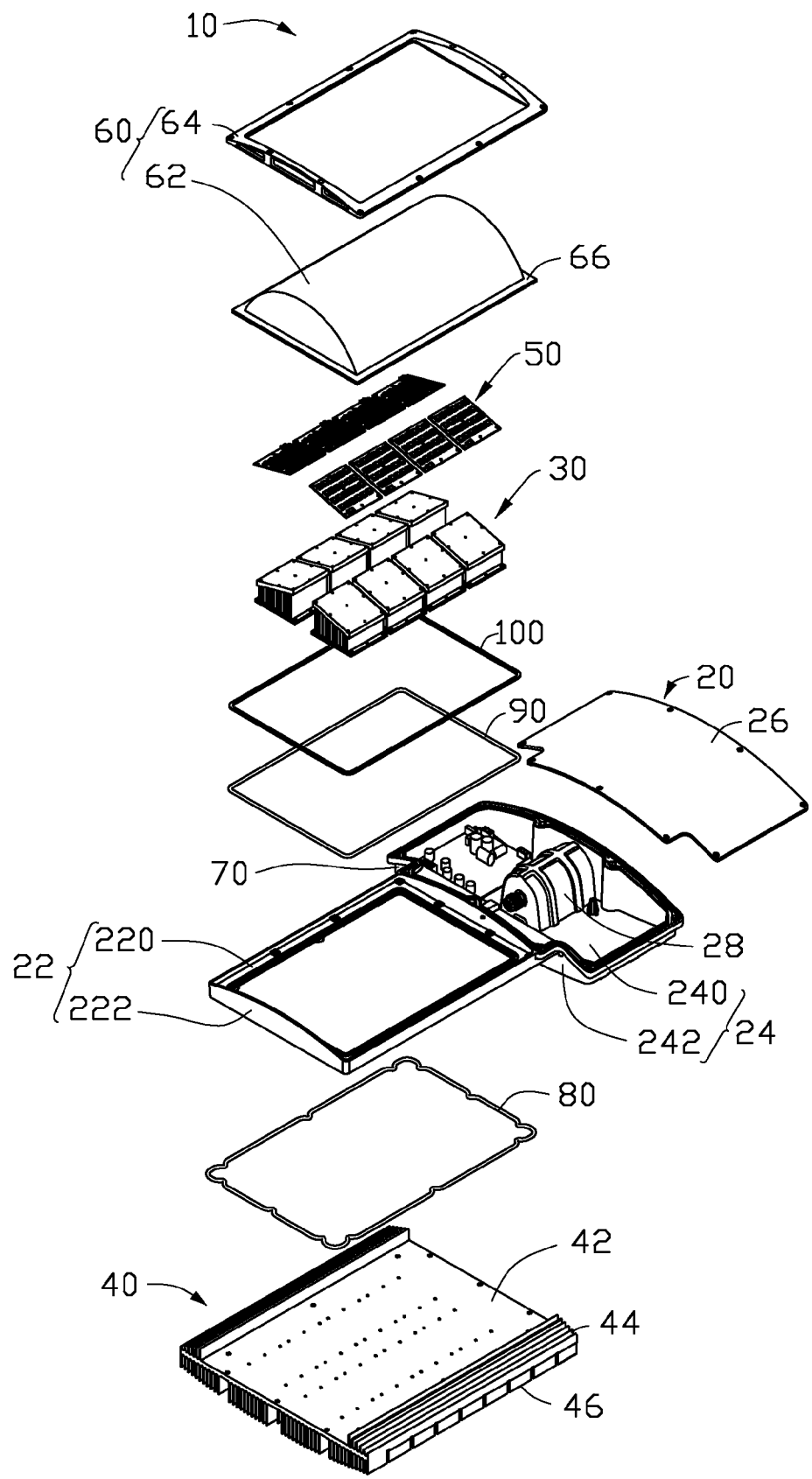
FIG. 2 is an exploded view of FIG. 1.

Referring to FIGS. 1-2, an LED lamp 10 in accordance with an embodiment of the present invention includes a lamp frame 20, a heat absorbing member 30 located at a top side of the lamp frame 20, a heat sink 40 located at a bottom side of the lamp frame 20, a plurality of LED modules 50 thermally attached on the heat absorbing member 30, and an envelope 60 engaging with the lamp frame 20 and receiving the heat absorbing member 30 and the LED modules 50 therein.

Referring to FIG. 2, the lamp frame 20 comprises a rectangular frame body 22, a cavity body 24 extending from an end of the frame body 22 and an arc-like cover 26 covering the cavity body 24. The frame body 22 comprises four interconnecting strips 220 at a bottom thereof and four interconnecting sidewalls 222 extending upwardly from corresponding strips 220. The cavity body 24 comprises a bottom wall 240 and four interconnecting sidewalls 242 extending upwardly from a periphery of the bottom wall 240. The bottom wall 240 has an arc-like configuration and two ends thereof tilt upwardly. The bottom wall 240 extends downwardly beyond a bottom of the frame body 22. Two opposite sides of the cavity body 24 extend beyond two corresponding sides of the frame body 22. One of the sidewalls 242 is close to the frame body 22 and separates the frame body 22 from the cavity body 24. An arch bridge 28 extends upwardly from a middle of the bottom wall 240. Under the bridge 28, a mounting hole (not shown) extends through an outer one of the sidewalls 242 of the cavity body 24 for engagingly receiving a top end of a pole (not shown) therein when the LED lamp 10 is used. In this embodiment, a driving circuit board 70 is received in the cavity body 24 at one side of the arch bridge 28. In other embodiments, two driving circuit board 70 are received in the cavity body 24 at two opposite sides of the bridge 28.

Figure 3:
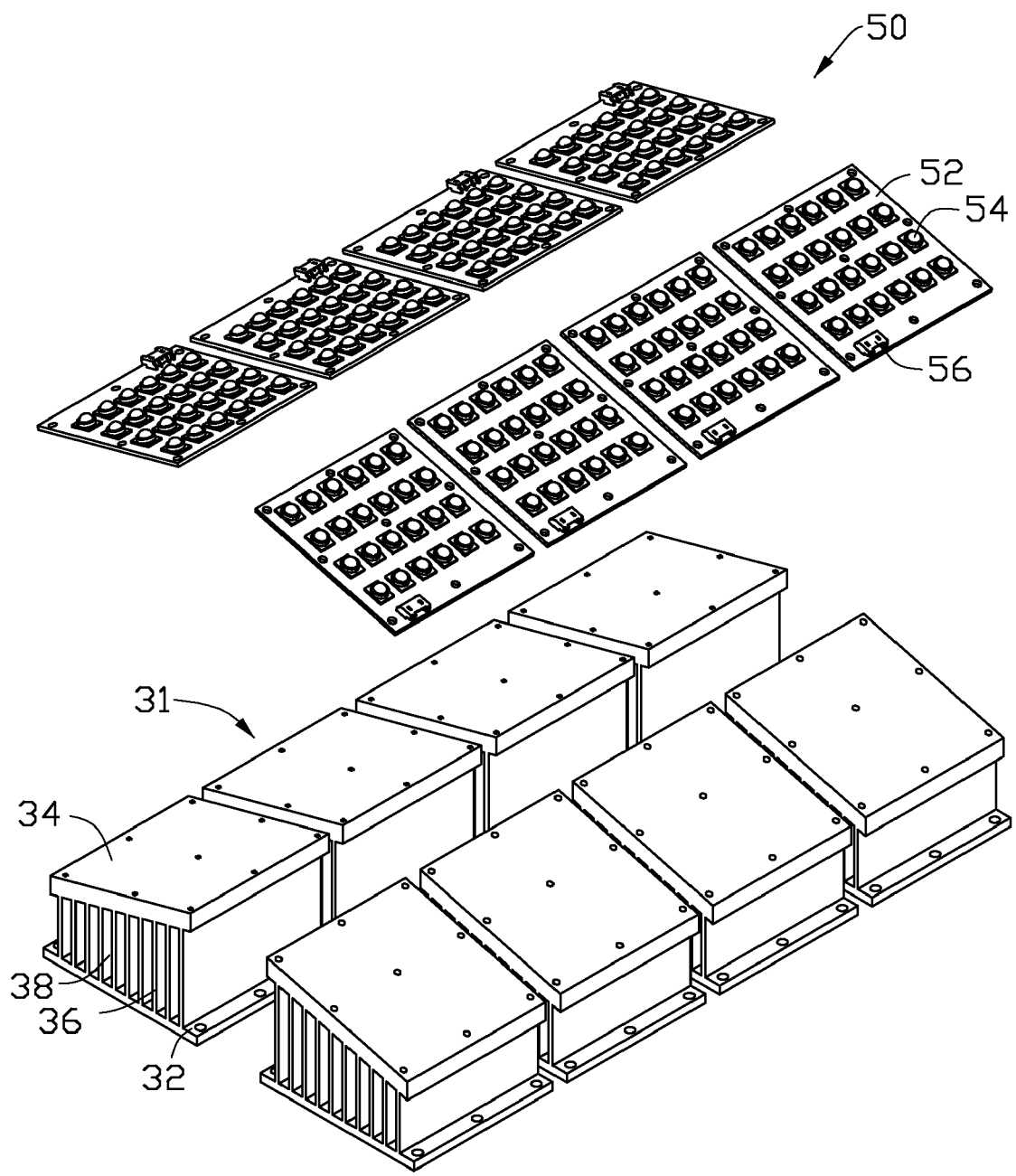
FIG. 3 shows LED modules and a heat absorbing member of FIG. 2.

Referring to FIG. 3 also, the heat absorbing member 30 is made from metal such as aluminum, copper or other metal material. In this embodiment, the heat absorbing member 30 consists of eight heat absorbing portions 31. These heat absorbing portions 31 are evenly arrayed in two rows; each row is parallel to a lateral side of the frame body 22. Each of the heat absorbing portions 31 comprises a rectangular bottom board 32, a top board 34 located above the bottom board 32 and a plurality of connecting boards 36 connecting the bottom board 32 and the top board 34. The top boards 34 incline downwardly from inside to outside of the heat absorbing member 30, which results in that the top boards 34 of two rows incline downwardly toward two opposite sides of the heat absorbing member 30. An acute angle is defined between the top board 34 and the bottom board 32. The top board 34 is spaced from the bottom board 32. A projection of the top board 34 on the heat sink 40 laps over that of the bottom board 32. The connecting boards 36 are perpendicular to the bottom board 32. These connecting boards 36 are parallel to each other, and are spaced from each other to define a plurality of air passages 38. Heights of the connecting boards 36 are gradually decreased from inside to outside of the heat absorbing member 30.

Figure 4:
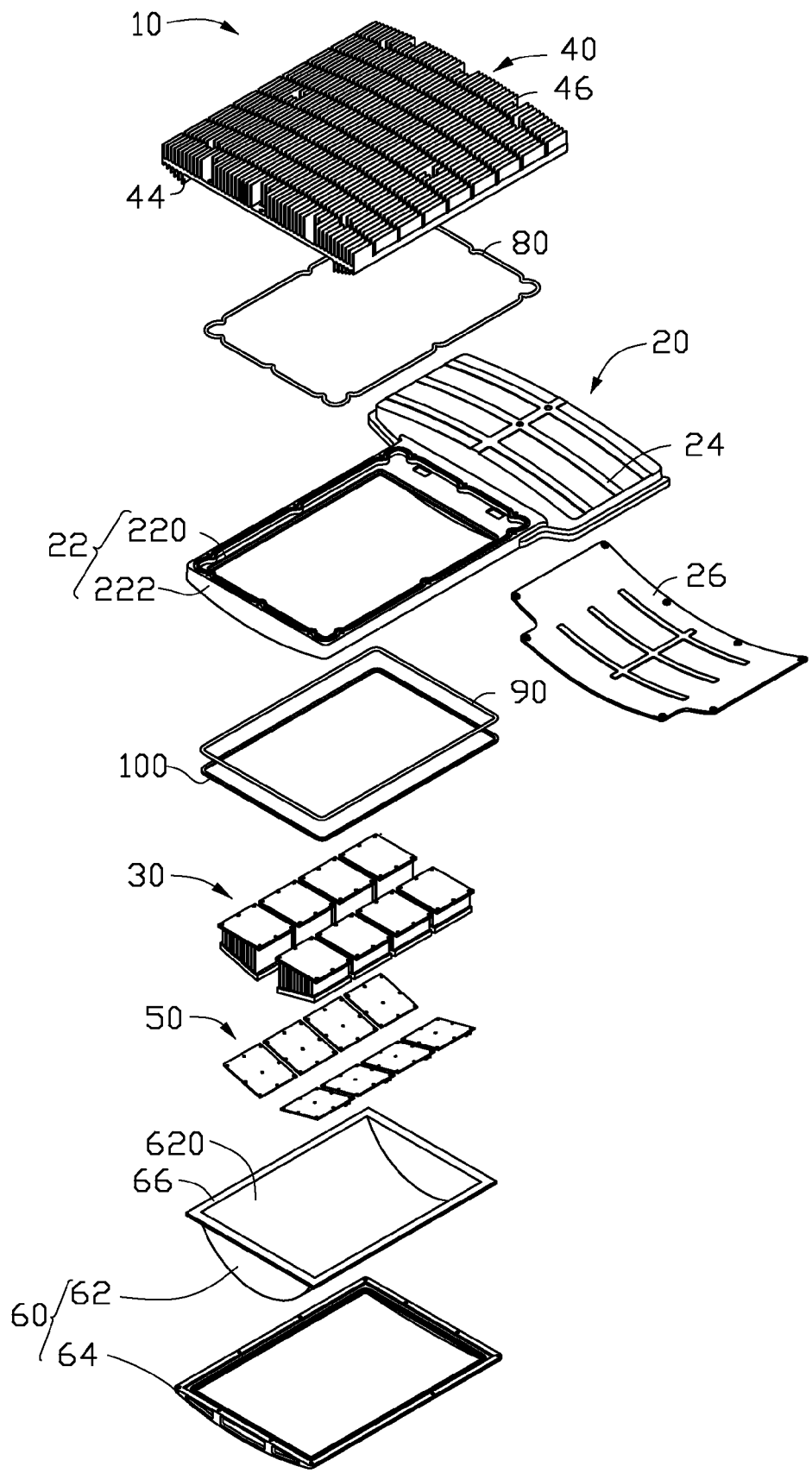
FIG. 4 is a view similar to FIG. 2, but viewed from another aspect.

Referring to FIG. 2, the heat sink 40 is made of metal having a good thermal conductivity such as copper or aluminum. The heat sink 40 comprises a flat base 42, a plurality of first fins 44 extending from a top face of the base 42 and a plurality of second fins 46 extending from a bottom face of the base 42. The first fins 44 are parallel to each other and extend upwardly from two opposite lateral portions of the top face of the flat base 42, thereby defining a space (not shown) therebetween for receiving the heat absorbing member 30 therein. Heights of the first fins 44 are gradually increased from two opposite lateral sides to a center of the base 42. Referring to FIG. 4 also, the second fins 46 are parallel to each other, and heights of the second fins 46 are gradually increased from two opposite sides to the center of the base 42, thereby defining an arced bottom face by bottom ends of the second fins 46. The frame body 22 of the lamp frame 20 is attached to the center of the base 42 and parallel to the first fins 44 for receiving the heat absorbing member 30 therein. The cavity body 24 of the lamp frame 20 extends beyond the heat sink 40. A rectangular ring-shaped gasket 80 is sandwiched between the frame body 22 and the heat sink 40.

Referring to FIG. 3, each of the LED modules 50 comprises a rectangular circuit board 52, a plurality of LEDs 54 evenly arranged on a top side of the circuit board 52 and a socket 56 located at a corner of the circuit board 52. A bottom side of the circuit board 52 is attached on the top board 34 of the heat absorbing member 30. These LEDs 54 are arrayed in many rows; each row is parallel to an upper edge of the circuit board 52, and two ends of each row extend to corresponding lateral edges of the circuit board 52. The socket 56 is used to electrically connect the driving circuit board 70. An area of the circuit board 52 is identical to that of the top board 34. The areas of the circuit board 52 and the top board 34 can be different in other embodiments. A number of the heat absorbing portions 31 is identical to that of the LED modules 50. The numbers of the heat absorbing portions 31 and the LED modules 50 can be different in other embodiments. In this embodiment, the numbers of the heat absorbing portions 31 and the LED modules 50 are both eight. A lightness of the LED lamp 10 is changed by a change of the number of the LED modules 50.

Referring to FIG. 4 also, the envelope 60 is made of transparent material such as plastic, glass, or other suitable material availing to transmit light. The envelope 60 comprises a lid 62, four interconnecting rims 66 extending outwardly from a circumference of the lid 62 and a pressing portion 64 pressing on these rims 66 and engaging with the frame body 22. The lid 62 has a half-columniform configuration. An opening 620 is oriented toward the heat sink 40. The pressing portion 64 presses on the rims 66 and engages with the frame body 22 by screws (not shown) to receive the LED modules 50 and the heat absorbing member 30 in the lid 62. A rectangular ring-shaped gasket 90 is sandwiched between the rims 66 and the interconnecting strips 220. A rectangular, ring-shaped cushion 100 is sandwiched between the rims 66 and the pressing portion 64.

In use of the LED lamp 10, when the LEDs 54 of the LED modules 50 emit light, heat generated by the LEDs 54 is absorbed by the heat absorbing member 30 and then transferred to the heat sink 40. And most of the heat is dispersed into ambient cool air by the fins 44, 46. Thus, a temperature of the LEDs 54 is decreased and the LED lamp 10 has an improved heat dissipation efficiency for preventing the LEDs 54 from overheating. Additionally, the top boards 34 incline downwardly from inside to outside of the heat absorbing member 30, which results in that the top boards 34 of two rows orient toward two opposite sides of the heat absorbing member 30. Consequently, the LED modules 50 attached on the top boards 34 incline outwardly and are also oriented toward two opposite sides of the heat absorbing member 30. Therefore, light radiated from the LED modules 50 is distributed over a large region.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An LED lamp comprising:
a lamp frame;
a heat sink made of metal and being located at a side of the lamp frame;
a plurality of LED modules;
an envelope attached to an opposite side of the lamp frame and receiving the LED modules therein; and
at least two heat absorbing portions made of metal and being located in the envelope, the heat absorbing portions comprising bottom boards connecting with the heat sink and top boards being oblique, the LED modules being mounted on the top boards, an angle being defined between the top boards and between the top boards and the bottom boards.

2. The LED lamp as claimed in claim 1, wherein the top boards of the at least two heat absorbing portions are oriented toward two different directions respectively.

3. The LED lamp as claimed in claim 1, wherein each of the at least two heat absorbing portions further comprises a plurality of connecting boards connecting the top board and the bottom board thereof.

4. The LED lamp as claimed in claim 3, wherein the connecting boards are perpendicular to the bottom board.

5. The LED lamp as claimed in claim 1, wherein a plurality of air passages are defined between the connecting boards.

6. The LED lamp as claimed in claim 1, wherein the top board has a projection on the heat sink lapping over a projection of the bottom board on the heat sink.

7. The LED lamp as claimed in claim 1, wherein the heat sink comprises a base, and the bottom boards of the heat absorbing portions are attached on a middle of the base.

8. The LED lamp as claimed in claim 7, wherein the heat sink further comprises a plurality of first fins extending from two opposite lateral portions of a top face of the base and a plurality of second fins extending from a bottom face of the base, and the first fins are located at two sides of the heat absorbing portions.

9. The LED lamp as claimed in claim 1, wherein the lamp frame comprises a frame body, a cavity body extending from an end of the frame body and a cover covering the cavity body.

10. The LED lamp as claimed in claim 9, wherein the envelope comprises a lid receiving the heat absorbing portions therein, the LED lamp further comprising a pressing portion pressing on a circumferential edge of the lid and engaging with the frame body.

11. The LED lamp as claimed in claim 10, wherein four rims extend outwardly from a circumferential edge of the lid, the frame body being pressed by the rims.

12. An LED lamp comprising:
a lamp frame;
a heat sink made of metal and being located at a side of the lamp frame;
a plurality of LED modules;
an envelope attached to an opposite side of the lamp frame and receiving the LED modules therein; and
at least two heat absorbing portions on which the LED modules are attached being made of metal and located in the envelope, the at least two heat absorbing portions comprising bottom boards connecting with the heat sink and top boards being oblique and opposite to the bottom boards, an angle being defined between the top boards, the top boards of the heat absorbing portions being oriented toward two different directions.

13. The LED lamp as claimed in claim 12, wherein each of the at least two heat absorbing portions further comprises a plurality parallel connecting boards connecting the top board and the bottom board thereof, the connecting boards are perpendicular to the bottom board, and a plurality of air passages are defined between the connecting boards.

14. The LED lamp as claimed in claim 12, wherein the heat sink comprises a base, and the bottom boards of the at least two heat absorbing portions are attached on a middle of the base.

15. The LED lamp as claimed in claim 14, wherein the heat sink further comprises a plurality of first fins extending from two opposite lateral portions of a top face of the base and a plurality of second fins extending from a bottom face of the base, and the first fins are located at two sides of the at least two heat absorbing portions.

16. The LED lamp as claimed in claim 15, wherein heights of the first fins are gradually increased from two opposite lateral sides to a center of the base, and heights of the second fins are gradually increased from two opposite sides to the center of the base.

* * * * *